(12) United States Patent
Sawabe et al.

(10) Patent No.: US 9,109,790 B2
(45) Date of Patent: Aug. 18, 2015

(54) LIQUID CONTAINER, CONTAINER ILLUMINATION DEVICE, CONTAINER MEMBER, AND CONTAINER ILLUMINATION SYSTEM

(71) Applicant: Kabushiki Kaisha Toshiba, Minato-ku (JP)

(72) Inventors: Tomoaki Sawabe, Tokyo (JP); Yasushi Shinjo, Kanagawa-ken (JP); Shintaro Enomoto, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 55 days.

(21) Appl. No.: 14/077,644

(22) Filed: Nov. 12, 2013

(65) Prior Publication Data

US 2014/0140047 A1    May 22, 2014

(30) Foreign Application Priority Data

Nov. 20, 2012 (JP) ................................. 2012-254575

(51) Int. Cl.
  F21V 33/00       (2006.01)
  H01L 51/52       (2006.01)
  F21Y 105/00      (2006.01)

(52) U.S. Cl.
  CPC ............ F21V 33/00 (2013.01); H01L 51/5262 (2013.01); F21Y 2105/008 (2013.01); H01L 51/5268 (2013.01); H01L 2251/5361 (2013.01)

(58) Field of Classification Search
  CPC .............. F21V 33/00; F21Y 2105/008; H01L 51/5262; H01L 51/5268; H01L 2251/50; H01L 2251/5361
  USPC .................................................. 362/84, 101
  See application file for complete search history.

(56) References Cited

U.S. PATENT DOCUMENTS

| 2009/0153026 A1 | 6/2009 | Tchakarov et al. |
| 2013/0182418 A1 | 7/2013 | Sawabe et al. |
| 2013/0207094 A1 | 8/2013 | Tchakarov |
| 2013/0248825 A1 | 9/2013 | Sugizaki et al. |
| 2013/0250214 A1 | 9/2013 | Sugi et al. |
| 2013/0250557 A1 | 9/2013 | Sugizaki et al. |

FOREIGN PATENT DOCUMENTS

| FR | 2 965 407 A1 | 3/2012 |
| JP | 2011-141992 A | 7/2011 |

OTHER PUBLICATIONS

Extended European Search Report issued Apr. 17, 2014 in Patent Application No. 13193060.4.
Office Action mailed May 13, 2015 in European Application No. 13 193 060.4 (w/English translation).

*Primary Examiner* — Jason Moon Han
(74) *Attorney, Agent, or Firm* — Oblon, McClelland, Maier & Neustadt, L.L.P.

(57) ABSTRACT

According to one embodiment, a liquid container includes a tank unit and a light emitting unit. The tank unit is capable of storing a liquid in an interior of the tank unit. At least one portion of the tank unit is light-transmissive. The light emitting unit contacts the at least one portion. The light emitting unit includes a first electrode opposing an outer surface of the at least one portion, a second electrode provided between the first electrode and the at least one portion, the second electrode being light-transmissive, and an organic light emitting layer provided between the first electrode and the second electrode.

19 Claims, 8 Drawing Sheets

LIQUID CONTAINER, CONTAINER ILLUMINATION DEVICE, CONTAINER MEMBER, AND CONTAINER ILLUMINATION SYSTEM

CROSS-REFERENCE TO RELATED APPLICATIONS

This application is based upon and claims the benefit of priority from Japanese Patent Application No. 2012-254575, filed on Nov. 20, 2012; the entire contents of which are incorporated herein by reference.

FIELD

Embodiments described herein relate generally to a liquid container, a container illumination device, a container member, and a container illumination system.

BACKGROUND

In recent years, organic electroluminescent elements are drawing attention in applications such as flat light sources, etc. Various applications are expected for organic electroluminescent elements due to features such as being thin and lightweight, having a surface light emission, etc.

DETAILED DESCRIPTION

Figure 1A:
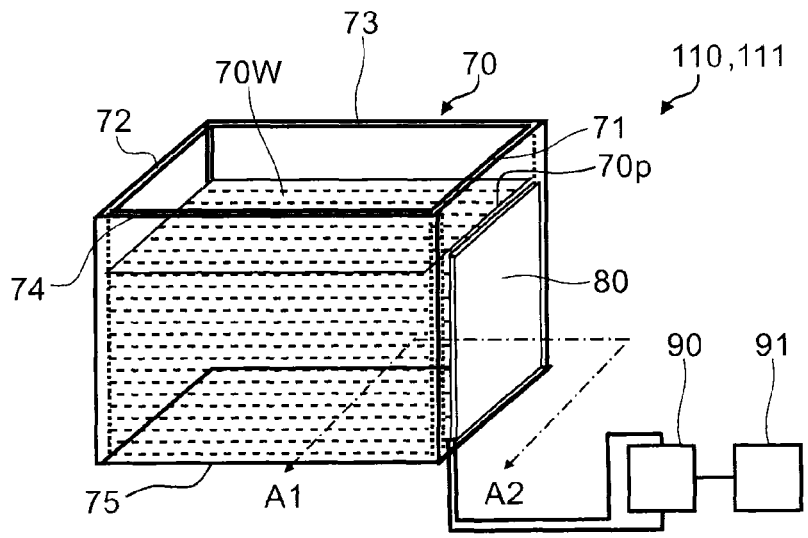
FIG. 1A to FIG. 1C are schematic views showing a liquid container according to a first embodiment.

According to one embodiment, a liquid container includes a tank unit and a light emitting unit. The tank unit is capable of storing a liquid in an interior of the tank unit. At least one portion of the tank unit is light-transmissive. The light emitting unit contacts the at least one portion. The light emitting unit includes a first electrode opposing an outer surface of the at least one portion, a second electrode provided between the first electrode and the at least one portion, the second electrode being light-transmissive, and an organic light emitting layer provided between the first electrode and the second electrode.

According to one embodiment, a container illumination device includes a light emitting unit and an adhesion layer. The light emitting unit includes a first electrode, a second electrode, and an organic light emitting layer provided between the first electrode and the second electrode. The light emitting unit has a light emitting surface provided on a side of the second electrode. The adhesion layer is provided on the light emitting surface. The adhesion layer is light-transmissive and capable of adhering the light emitting surface to at least one portion of a tank unit capable of storing a liquid in an interior of the tank unit. The at least one portion is light-transmissive.

According to one embodiment, a container member includes a substrate unit and a light emitting unit. The substrate unit is configured to be used as a portion of a tank unit capable of storing a liquid in an interior of the tank unit. At least one portion of the tank unit is light-transmissive. The light emitting unit includes a first electrode opposing the substrate unit, a second electrode provided between the first electrode and the substrate unit, the second electrode being light-transmissive, and an organic light emitting layer provided between the first electrode and the second electrode.

According to one embodiment, a container illumination system includes a tank unit, a light emitting unit and a control unit. The tank unit is capable of storing a liquid in an interior of the tank unit. At least one portion of the tank unit is light-transmissive. The light emitting unit includes a first electrode opposing an outer surface of the at least one portion, a second electrode provided between the first electrode and the at least one portion, the second electrode being light-transmissive, and an organic light emitting layer provided between the first electrode and the second electrode. The control unit is configured to control a current flowing between the first electrode and the second electrode.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

Figure 1B:
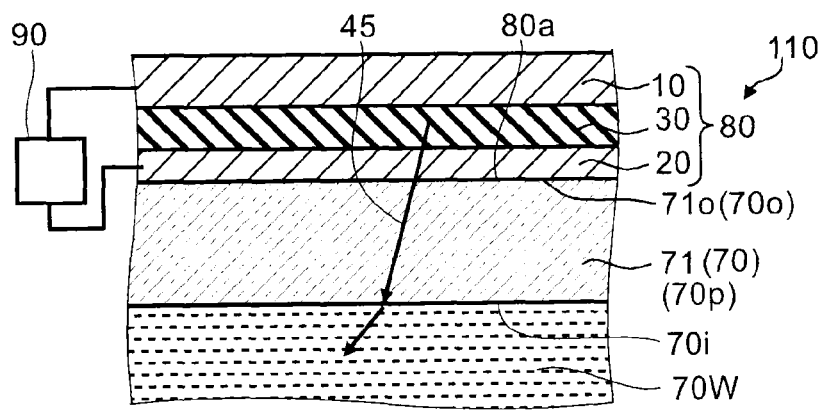
Figure 1C:
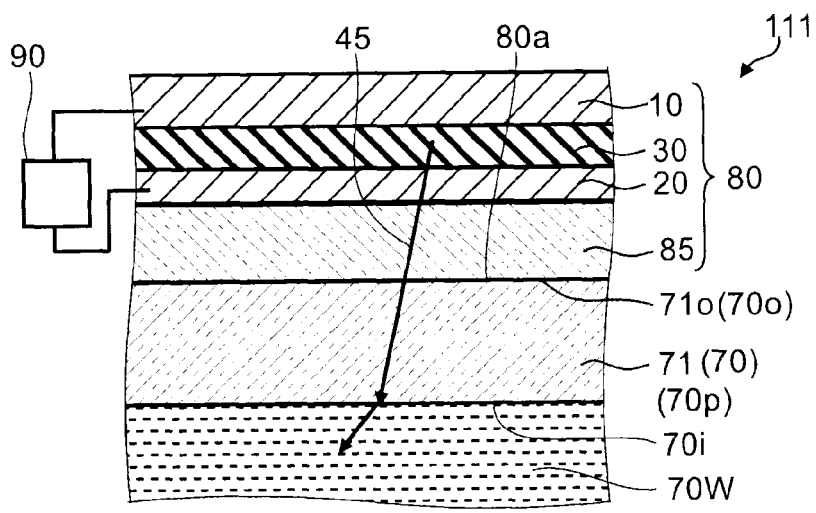

FIG. 1A to FIG. 1C are schematic views showing a liquid container according to a first embodiment.

FIG. 1A is a perspective view. FIG. 1B is a cross-sectional view along line A1-A2 of FIG. 1A. FIG. 1C is another example of the cross section along line A1-A2.

As shown in FIG. 1A, the liquid container 110 according to the embodiment includes a tank unit 70 and a light emitting unit 80.

The tank unit 70 is capable of storing a liquid 70W in the interior of the tank unit 70. The tank unit 70 includes, for example, first to fourth side portions 71 to 74 and a bottom portion 75. The second side portion 72 is separated from the first side portion 71. The third side portion 73 is connected to one end of the first side portion 71 and one end of the second side portion 72. The fourth side portion 74 is separated from the third side portion 73. The fourth side portion 74 is connected to one other end of the first side portion 71 and one other end of the second side portion 72. The first to fourth side portions 71 to 74 are connected to the bottom portion 75. There are no gaps between the mutually-adjacent first to fourth side portions 71 to 74. There are no gaps between the bottom portion 75 and the first to fourth side portions 71 to 74. A space is partitioned from the outside by the first to fourth side portions 71 to 74 and the bottom portion 75. The liquid 70W can be contained inside the space.

In the embodiment, a connection member may be provided between the first to fourth side portions 71 to 74. A connection member may be provided between the bottom portion 75 and the first to fourth side portions 71 to 74. The configuration and size of the tank unit 70 are arbitrary.

The tank unit 70 is mounted, for example, indoors; and, for example, fish, etc., may be kept in the interior of the tank unit 70. A person may enter the tank unit 70. The tank unit 70 may be, for example, a bathtub. The tank unit 70 may be a swimming pool in which people swim. The tank unit 70 may be mounted outdoors and may be, for example, a pond. A fountain may be provided in the pond. The tank unit 70 may be a water tank for decorating a building. A lid may be provided on the tank unit 70. Persons, vehicles, etc., may pass over the lid.

The liquid 70W is, for example, water. The liquid 70W may be oil. The liquid 70W may be a mixture. In the embodiment, the liquid 70W may include any liquid substance.

At least one portion 70p of the tank unit 70 is light-transmissive. The tank unit 70 may include, for example, glass that is light-transmissive. The tank unit 70 may include, for example, an organic resin that is light-transmissive. The organic resin may include, for example, acrylic, etc. At least one selected from the bottom portion 75 and the first to fourth side portions 71 to 74 may include, for example, glass or an organic resin that is light-transmissive. An example will now be described in which glass that is light-transmissive is used as the first to fourth side portions 71 to 74 and the bottom portion 75.

The light emitting unit 80 is provided outside the tank unit 70. The light emitting unit 80 contacts the at least one portion 70p of the tank unit 70 recited above.

In the example, the light emitting unit 80 contacts the first side portion 71. In the embodiment, the light emitting unit 80 is provided to oppose, for example, at least one selected from the bottom portion 75 and the first to fourth side portions 71 to 74. Hereinbelow, the example in which the light emitting unit 80 is provided to oppose the first side portion 71 will be described to simplify the description.

As shown in FIG. 1B, the light emitting unit 80 opposes the first side portion 71; and the light emitting unit 80 contacts the first side portion 71. The light emitting unit 80 includes a first electrode 10, a second electrode 20, and an organic light emitting layer 30.

The first electrode 10 opposes the first side portion 71. In other words, the first electrode 10 opposes an outer surface 70o of a light-transmissive portion (the at least one portion 70p recited above) of the tank unit 70.

The second electrode 20 is provided between the first side portion 71 (the at least one portion 70p of the tank unit 70 recited above) and the first electrode 10. The second electrode 20 is light-transmissive.

The organic light emitting layer 30 is provided between the first electrode 10 and the second electrode 20.

The light emitting unit 80 has a light emitting surface 80a. The light emitting surface 80a is the surface on the second electrode 20 side. A voltage is applied between the first electrode 10 and the second electrode 20. For example, the first electrode 10 is a cathode; and the second electrode 20 is an anode.

As shown in FIG. 1A, the liquid container 110 may further include a drive unit 90. The drive unit 90 is connected to the first electrode 10 and the second electrode 20. The drive unit 90 supplies a current to the light emitting unit 80 to flow between the first electrode 10 and the second electrode 20.

The liquid container 110 may further include a control unit 91. The control unit 91 controls the drive unit 90; and the control unit 91 controls the current flowing between the first electrode 10 and the second electrode 20. The drive unit 90 may be included in the control unit 91. The control unit 91 is not shown in FIG. 1B and FIG. 1C. The control unit 91 may be provided if necessary and may be omitted.

Light 45 (emitted light) is emitted from the organic light emitting layer 30 due to the current flowing between the first electrode 10 and the second electrode 20. The light 45 is emitted mainly from the light emitting surface 80a.

As shown in FIG. 1B, the light 45 is incident on the liquid 70W by passing through the first side portion 71 of the tank unit 70. In the embodiment, the tank unit 70 and the light emitting unit 80 contact each other. Accordingly, an air layer substantially is not interposed between the tank unit 70 and the light emitting unit 80. The tank unit 70 and the liquid 70W contact each other. Reflection of the light at an interface 70i between the tank unit 70 and the liquid 70W can be suppressed. Thereby, the light 45 can efficiently enter the liquid 70W from the light emitting unit 80. The light emitting unit 80 can efficiently illuminate the liquid 70W.

In a first reference example in which the light emitting unit 80 is mounted to be separated from the tank unit 70, there is an air layer between the light emitting unit 80 and the tank unit 70. The refractive index of the air layer is lower than the refractive index of the tank unit 70. The light 45 is easily reflected at the interface between the light emitting unit 80 and the air layer; and the light 45 cannot efficiently enter the air layer. The light 45 is easily reflected at the interface between the air layer and the tank unit 70; and the light 45 cannot efficiently enter the tank unit 70. Therefore, in the first reference example, it is difficult to efficiently illuminate the liquid 70W.

On the other hand, there is a second reference example in which the light emitting unit 80 is provided above the liquid 70W contained in the tank unit 70. In the second reference example, the light emitting unit 80 and the liquid 70W are separated from each other; and there is an air layer between the light emitting unit 80 and the liquid 70W. The refractive index of the air layer is lower than the refractive index of the light emitting unit 80. Therefore, the light 45 is easily reflected at the interface between the light emitting unit 80 and the air layer; and the light 45 cannot efficiently enter the air layer. The light 45 is easily reflected at the interface between the air layer and the liquid 70W; and the light 45 cannot efficiently enter the liquid 70W. Therefore, in the second reference example as well, it is difficult to efficiently illuminate the liquid 70W.

Conversely, in the liquid container 110 according to the embodiment, the tank unit 70 and the light emitting unit 80 contact each other; and there is substantially no air layer. Thereby, the light 45 can efficiently enter the liquid 70W from the light emitting unit 80; and the liquid 70W can be illuminated efficiently.

In the liquid container 111 according to the embodiment as shown in FIG. 1C, the light emitting unit 80 further includes a substrate 85. Otherwise, the liquid container 111 is similar to the liquid container 110.

The substrate 85 contacts the tank unit 70 (the at least one portion 70*p* of the tank unit 70 recited above). In the example, the substrate 85 contacts the first side portion 71. The substrate 85 may include, for example, glass, an organic resin, etc. The organic resin may include, for example, acrylic, etc. The substrate 85 is light-transmissive.

As shown in FIG. 1C, in such a case as well, the light 45 is incident on the liquid 70W by passing through the first side portion 71 of the tank unit 70. In the liquid container 111 as well, the light 45 can efficiently enter the liquid 70W from the light emitting unit 80; and the liquid 70W can be illuminated efficiently.

Light extraction efficiencies calculated by an optical simulation are as follows. The light extraction efficiency is the proportion of the light that enters the liquid 70W to the light 45 emitted from the organic light emitting layer 30. For example, in the case where the light emitting unit 80 is separated from the tank unit 70 as in the first reference example recited above, the light extraction efficiency is, for example, about 15%. Conversely, the light extraction efficiency of the embodiment (the liquid containers 110 and 111) is about 33%. Thus, according to the embodiment, a high light extraction efficiency can be obtained; and the liquid 70W can be illuminated efficiently.

In the embodiment, the light emitting unit 80 contacts the tank unit 70. The liquid 70W is contained inside the tank unit 70. Therefore, the heat generated at the light emitting unit 80 is conducted efficiently to the liquid 70W via the tank unit 70 (e.g., the first side portion 71). The heat dissipation of the light emitting unit 80 is good. Thereby, degradation of the light emitting unit 80 due to the heat can be suppressed. According to the embodiment, the lifetime of the light emitting unit 80 can be lengthened.

For example, in an accelerated lifetime test at high luminance, the lifetime of the light emitting unit 80 is, for example, 1000 hours when the light emitting unit 80 is operated at room temperature (e.g., 25° C.). The lifetime is, for example, the operation time when ½ of the initial brightness is reached. The lifetime of the light emitting unit 80 is, for example, 300 hours when the light emitting unit 80 is operated at 60° C. The lifetime of the light emitting unit 80 is, for example, 50 hours when the light emitting unit 80 is operated at 100° C. Thus, the lifetime of the light emitting unit 80 shortens as the operation temperature increases.

In the embodiment, the heat is efficiently conducted to the liquid 70W; and the heat dissipation is good. Therefore, the degradation of the light emitting unit 80 due to the heat can be suppressed. According to the embodiment, the lifetime of the light emitting unit 80 can be lengthened.

Thus, according to the embodiment, a liquid container that can illuminate the liquid 70W efficiently and has a long lifetime can be provided.

The first electrode 10 is, for example, light-reflective. The first electrode 10 is reflective to the light emitted from the organic light emitting layer 30. The optical reflectance of the first electrode 10 is higher than the optical reflectance of the second electrode 20. In the specification of the application, the state of being light-reflective is the state of having an optical reflectance that is higher than the optical reflectance of the second electrode 20.

The first electrode 10 includes, for example, at least one selected from aluminum and silver. For example, the first electrode 10 includes an aluminum film. An alloy of silver and magnesium may be used as the first electrode 10. Calcium may be added to the alloy. The first electrode 10 functions as, for example, a cathode.

The first electrode 10 may include, for example, a first film that is light-reflective, and a second film that is stacked with the first film and is made of a material different from the first film. The second film may include, for example, a film that is light-transmissive.

The second electrode 20 includes, for example, an oxide including at least one element selected from the group consisting of In, Sn, Zn, and Ti. The second electrode 20 may include, for example, at least one selected from indium oxide, zinc oxide, tin oxide, indium tin oxide (ITO), and fluorine doped tin oxide (FTO). The second electrode 20 may be formed by, for example, vapor phase deposition such as sputtering, vacuum evaporation, etc. The second electrode 20 may be formed by, for example, coating, spraying, etc. The second electrode 20 functions as, for example, an anode.

The refractive index of the second electrode 20 is, for example, not less than 1.6 and not more than 2.2.

Figure 2:
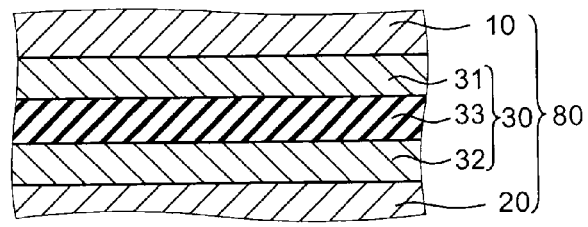
FIG. 2 is a schematic view showing a portion of the liquid container according to the first embodiment.

FIG. 2 is a schematic view showing a portion of the liquid container according to the first embodiment.

FIG. 2 shows the configuration of the light emitting unit 80. The substrate 85 is not shown in FIG. 2.

As shown in FIG. 2, the organic light emitting layer 30 includes a light emitting layer 33. The organic light emitting layer 30 may further include at least one selected from a first layer 31 and a second layer 32 if necessary. The light emitting layer 33 emits light of a wavelength of visible light. The first layer 31 is provided between the light emitting layer 33 and the first electrode 10. The second layer 32 is provided between the light emitting layer 33 and the second electrode 20.

The light emitting layer 33 may include, for example, a material such as Alq$_3$ (tris(8-hydroxyquinolinolato)aluminum), F8BT (poly(9,9-dioctylfluorene-co-benzothiadiazole), PPV (polyparaphenylene vinylene), etc.

The light emitting layer 33 may include a mixed material of a host material and a dopant added to the host material.

For example, CBP (4,4'-N,N'-bis dicarbazolyl-biphenyl), BCP (2,9-dimethyl-4,7 diphenyl-1,10-phenanthroline), TPD (4,4'-bis-N-3 methyl phenyl-N-phenylamino biphenyl), PVK (polyvinyl carbazole), PPT (poly(3-phenylthiophene)), etc., may be used as the host material.

For example, Flrpic (iridium (III) bis(4,6-di-fluorophenyl)-pyridinate-N,C2'-picolinate), Ir(ppy)$_3$ (tris(2-phenylpyridine)iridium), FIr6 (bis(2,4-difluorophenylpyridinato)-tetrakis(1-pyrazolyl)borate-iridium (III)), etc., may be used as the dopant material.

The first layer 31 may include, for example, a layer that functions as an electron injection layer. The electron injection layer includes, for example, at least one selected from lithium fluoride, cesium fluoride, lithium quinoline complex, etc. The first layer 31 may include, for example, a layer that functions as an electron transport layer. The electron transport layer includes, for example, at least one selected from $Alq_3$ (tris(8-quinolinolato)aluminum (III)), BAlq (bis(2-methyl-8-quinolinolato(p-phenylphenolate)aluminum), Bphen (bathophenanthroline), 3TPYMB (tris[3-(3-pyridyl)-mesityl] borane), etc. The first layer 31 may have, for example, a stacked structure of the layer that functions as the electron injection layer and the layer that functions as the electron transport layer. The first layer 31 may include a layer other than the layer that functions as the electron injection layer and the layer that functions as the electron transport layer.

The second layer 32 may function as, for example, a hole injection layer. The hole injection layer includes, for example, at least one selected from PEDPOT:PPS poly(3,4-ethylenedioxythiophene)-poly(styrenesulfonic acid), CuPc (copper phthalocyanine), $MoO_3$ (molybdenum trioxide), etc. The second layer 32 may function as, for example, a hole transport layer. The hole transport layer includes, for example, at least one selected from α-NPD (4,4'-bis[N-(1-naphthyl)-N-phenylamino]biphenyl), TAPC (1,1-bis[4-N,N-di(p-tolyl)amino]phenyl]cyclohexane), m-MTDATA (4,4',4"-tris[phenyl(m-tolyl)amino]triphenylamine), TPD (bis(3-methyl phenyl)-N,N'-diphenylbenzidine), TCTA (4,4',4"-tri (N-carbazolyl)triphenylamine), etc. The second layer 32 may have, for example, a stacked structure of the layer that functions as the hole injection layer and the layer that functions as the hole transport layer. The second layer 32 may include a layer other than the layer that functions as the hole injection layer and the layer that functions as the hole transport layer.

The stacked structure relating to the first electrode 10 and the second electrode 20 recited above is an example.

In the embodiment, the first electrode 10 may be the anode; and the second electrode 20 may be the cathode. In the embodiment, for example, at least one selected from the electron transport layer and the electron injection layer is provided on the cathode side. In the embodiment, for example, at least one selected from the hole transport layer and the hole injection layer is provided on the anode side.

For example, the organic light emitting layer 30 emits light having a component of a wavelength of visible light. For example, the light emitted from the organic light emitting layer 30 is substantially white light. In other words, the light emitted from the light emitting unit 80 is white light. The color of the light emitted from the light emitting unit 80 is substantially white. The color of the light emitted from the light emitting unit 80 is, for example, one selected from reddish white, yellowish white, greenish white, bluish white, and violet-tinted white.

In the embodiment, the color of the light emitted from the organic light emitting layer 30 may be red, orange, yellow, green, blue, indigo, or violet.

Figure 3:
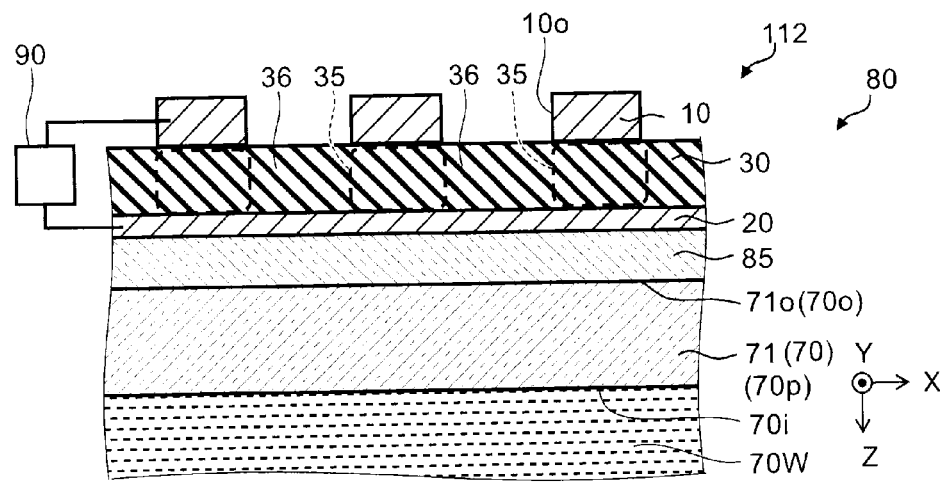
FIG. 3 is a schematic cross-sectional view showing another liquid container according to the first embodiment.

FIG. 3 is a schematic cross-sectional view showing another liquid container according to the first embodiment.

FIG. 3 is a cross-sectional view corresponding to the cross section along line A1-A2 of FIG. 1A.

In the liquid container 112 according to the embodiment as shown in FIG. 3, the first electrode 10 has an opening 10o. Otherwise, the configuration is similar to, for example, that of the liquid container 111, and a description is therefore omitted.

The direction from the first electrode 10 toward the second electrode 20 is taken as a stacking direction (a Z-axis direction). One axis perpendicular to the Z-axis direction is taken as an X-axis direction. A direction perpendicular to the Z-axis direction and the X-axis direction is taken as a Y-axis direction. A plane perpendicular to the stacking direction (the Z-axis direction) is taken as the X-Y plane.

The organic light emitting layer 30 has a superimposed portion 35 overlapping the first electrode 10 and a non-superimposed portion 36 not overlapping the first electrode when projected onto the X-Y plane. The first electrode 10 is light-reflective. The superimposed portion 35 is a portion that emits light. The non-superimposed portion 36 is a portion that substantially does not emit light.

In the liquid container 112, light can pass through the opening 10o. Therefore, an object inside the liquid 70W can be viewed by, for example, a user of the liquid container 112 via the opening 10o.

In the case where the first electrode 10 is reflective and the first electrode 10 is provided to cover the entire organic light emitting layer 30, the user cannot view the interior of the liquid 70W via the light emitting unit 80.

By providing the opening 10o in the first electrode 10 of the liquid container 112, the user can view the object inside the liquid 70W via the opening 10o. Thereby, for example, the liquid container has more applications. The designability of the liquid container increases.

The configuration (the pattern configuration when projected onto the X-Y plane) of the opening 10o is, for example, a stripe configuration. The configuration of the opening 10o may be, for example, an independent island configuration. The configuration of the conductive portion of the first electrode 10 may be, for example, a stripe configuration, a grid configuration, etc.

The liquid container 112 may further include the control unit 91.

Figure 4:
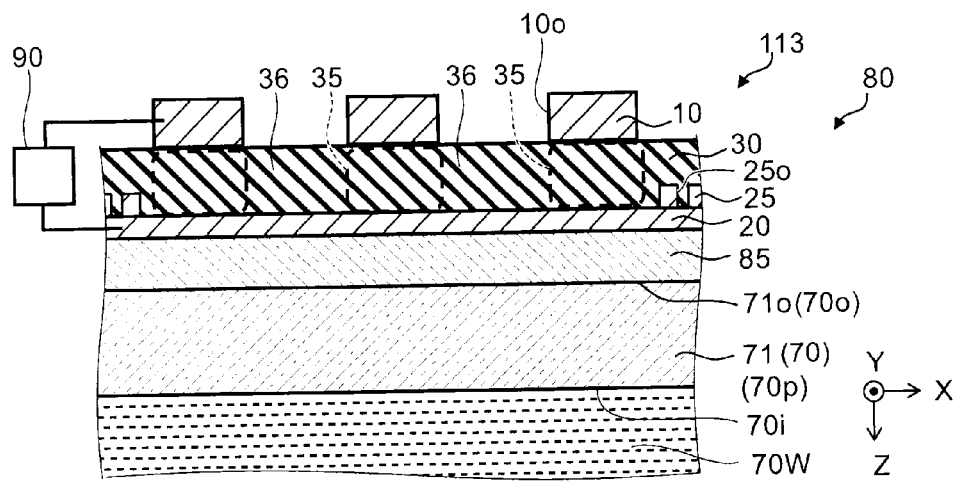
FIG. 4 is a schematic cross-sectional view showing another liquid container according to the first embodiment.

FIG. 4 is a schematic cross-sectional view showing another liquid container according to the first embodiment.

FIG. 4 is a cross-sectional view corresponding to the cross section along line A1-A2 of FIG. 1A.

As shown in FIG. 4, an interconnection 25 is provided in the liquid container 113 according to the embodiment. Otherwise, the configuration is similar to, for example, that of the liquid container 112, and a description is therefore omitted.

The interconnection 25 is electrically connected to the second electrode 20. The interconnection 25 contacts the second electrode 20. The resistivity of the interconnection 25 is lower than the resistivity of the second electrode 20. The conductivity of the interconnection 25 is higher than the conductivity of the second electrode 20. The optical transmittance of the interconnection 25 is, for example, lower than the optical transmittance of the second electrode 20. The optical transmittance of the interconnection 25 may be lower than, higher than, or the same as the optical transmittance of the first electrode 10.

The resistance of the second electrode 20 is relatively high because the second electrode 20 is light-transmissive. Therefore, there are cases where the brightness becomes nonuniform due to the in-plane voltage drop of the second electrode 20. The brightness can be made uniform by providing the interconnection 25 having the low resistance.

Thus, the interconnection 25 functions as, for example, an auxiliary electrode that suppresses the potential drop of the second electrode 20. The interconnection 25 may function as, for example, a lead electrode to supply the current.

An opening 25o may be provided in the interconnection 25. In such a case, the light passes through the opening 25o of the interconnection 25. Thereby, the lead electrode, etc., are substantially no longer visible to the user. For example, the liquid container has more applications. The designability of the liquid container increases.

The configuration (the pattern configuration when projected onto the X-Y plane) of the opening 25o of the interconnection 25 is, for example, a stripe configuration. The configuration of the opening 25o of the interconnection 25 may be, for example, an independent island configuration. The configuration of the conductive portion of the interconnection 25 may be, for example, a stripe configuration, a grid configuration, etc.

For example, in the case where the opening 10o is provided in the first electrode 10, the interconnection 25 overlaps at least a portion of the opening 10o when projected onto the X-Y plane.

In the example, the interconnection 25 is provided between the second electrode 20 and the organic light emitting layer 30. In the embodiment, the second electrode 20 may be disposed between the interconnection 25 and the organic light emitting layer 30.

The interconnection 25 includes, for example, at least one element selected from the group consisting of Mo, Ta, Nb, Al, Ni, and Ti. The interconnection 25 may be, for example, a mixed film including elements selected from the group. The interconnection 25 may be a stacked film including such elements. The interconnection 25 may include, for example, a stacked film of Nb/Mo/Al/Mo/Nb.

The liquid container 113 may further include the control unit 91.

In the liquid containers 110 to 114 recited above, the light emitting unit 80 also may be provided at a side portion other than the first side portion 71. The light emitting unit 80 may be provided at the bottom portion 75. The color of the light emitted from the light emitting unit 80 provided at the first side portion 71 may be different from the color of the light emitted from the light emitting unit 80 provided at another side portion (e.g., the second side portion 72). The color of the light emitted from the light emitting unit 80 provided at the first side portion 71 may be different from the color of the light emitted from the light emitting unit 80 provided at the bottom portion 75.

Figure 5:
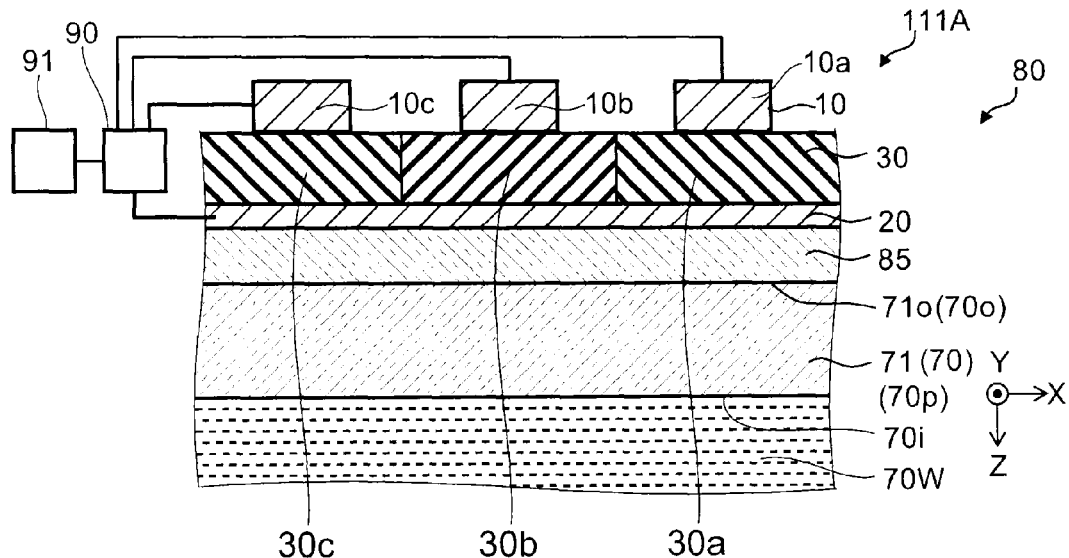
FIG. 5 is a schematic cross-sectional view showing another liquid container according to the first embodiment.

FIG. 5 is a schematic cross-sectional view showing another liquid container according to the first embodiment.

FIG. 5 is a cross-sectional view corresponding to the cross section along line A1-A2 of FIG. 1A.

As shown in FIG. 5, multiple first electrodes (e.g., first electrodes 10a, 10b, 10c, etc.) are provided in the liquid container 111A according to the embodiment. The organic light emitting layer 30 is provided between the second electrode 20 and each of the multiple first electrodes.

A first portion 30a of the organic light emitting layer 30 is provided between the first electrode 10a and the second electrode 20. A second portion 30b of the organic light emitting layer 30 is provided between the first electrode 10b and the second electrode 20. A third portion 30c of the organic light emitting layer 30 is provided between the first electrode 10c and the second electrode 20.

The light emission wavelength (e.g., the peak wavelength) of the second portion 30b is different from the light emission wavelength (e.g., the peak wavelength) of the first portion 30a. The light emission wavelength (e.g., the peak wavelength) of the third portion 30c is different from the light emission wavelength (e.g., the peak wavelength) of the first portion 30a and different from the light emission wavelength (e.g., the peak wavelength) of the second portion 30b.

In the case where the drive unit 90 is provided, the drive unit 90 is electrically connected to the multiple first electrodes (e.g., the first electrodes 10a, 10b, 10c, etc.).

The liquid container 111A may further include the control unit 91. The control unit 91 controls the current flowing in the multiple first electrodes (e.g., the first electrodes 10a to 10c, etc.).

The intensity of the light emitted from the portions (e.g., the first to third portions 30a to 30c, etc.) of the organic light emitting layer 30 may be controlled by the control unit 91. The liquid 70W contained in the tank unit 70 may be illuminated with light of various colors.

In the embodiment, the number of the multiple first electrodes 10 may be two. For example, the first electrode 10c may not be provided; and accordingly, the third portion 30c may not be provided.

Figure 6:
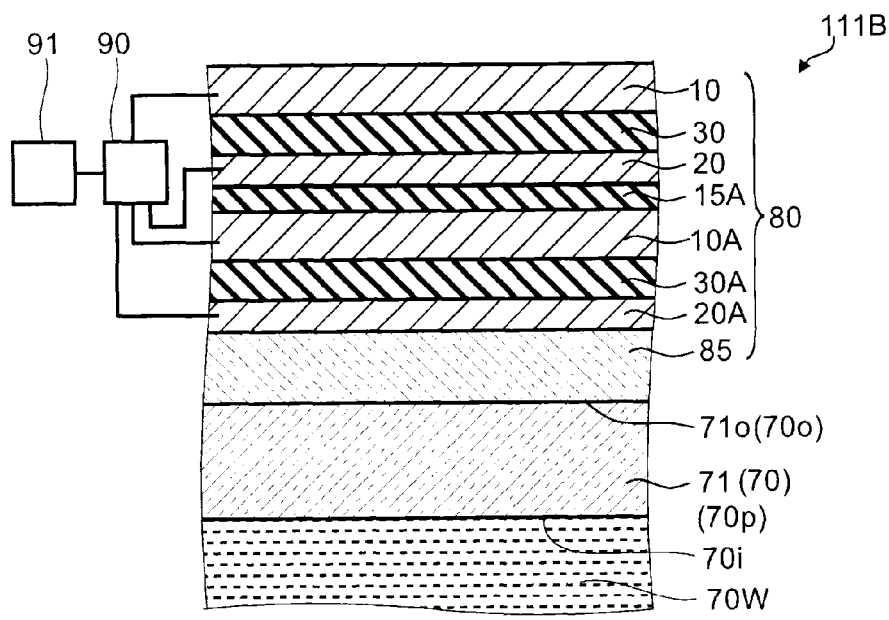
FIG. 6 is a schematic cross-sectional view showing another liquid container according to the first embodiment.

FIG. 6 is a schematic cross-sectional view showing another liquid container according to the first embodiment.

FIG. 6 is a cross-sectional view corresponding to the cross section along line A1-A2 of FIG. 1A.

In the liquid container 111B according to the embodiment as shown in FIG. 6, the light emitting unit 80 further includes a third electrode 10A, a fourth electrode 20A, a second organic light emitting layer 30A, and an insulating layer 15A. In such a case, the organic light emitting layer 30 is used as a first organic light emitting layer 30.

The fourth electrode 20A is provided between the second electrode 20 and the transmissive portion 70p of the tank unit 70. The third electrode 10A is provided between the fourth electrode 20A and the second electrode 20. The second organic light emitting layer 30A is provided between the third electrode 10A and the fourth electrode 20A. The insulating layer 15A is provided between the third electrode 10A and the second electrode 20.

The insulating layer 15A is light-transmissive. The insulating layer 15A may include, for example, a metal oxide, a metal nitride, a metal oxynitride, etc. The insulating layer 15A may include, for example, a $SiO_2$ film, etc. The insulating layer 15A may include an organic resin. The insulating layer 15A may include, for example, an acrylic resin, a silicone resin, etc.

For example, the configuration and materials described in regard to the first electrode 10 are applicable to the third electrode 10A. For example, the configuration and materials described in regard to the second electrode 20 are applicable to the fourth electrode 20A. For example, the configuration and materials described in regard to the second electrode 20 are applicable to the third electrode 10A. For example, the configuration and materials described in regard to the first electrode 10 are applicable to the fourth electrode 20A. For example, the third electrode 10A is a cathode; and the fourth electrode 20A is an anode. For example, the third electrode 10A may be the anode; and the fourth electrode 20A may be the cathode.

The configuration and materials described in regard to the first organic light emitting layer (the organic light emitting layer 30) are applicable to the second organic light emitting layer 30A. The light emission wavelength (e.g., the peak wavelength) of the second organic light emitting layer 30A may be different from the light emission wavelength (e.g., the peak wavelength) of the first organic light emitting layer (the organic light emitting layer 30).

In the case where the drive unit 90 is provided, the drive unit 90 is further connected to the third electrode 10A and the fourth electrode 20A. The drive unit 90 supplies the current to the light emitting unit 80 to flow between the third electrode 10A and the fourth electrode 20A.

The liquid container 111B may further include the control unit 91. The control unit 91 also controls the current flowing between the third electrode 10A and the fourth electrode 20A.

The intensity of the light emitted from the first organic light emitting layer (the organic light emitting layer 30) and the intensity of the light emitted from the second organic light emitting layer 30A may be controlled by the control unit 91. The liquid 70W contained in the tank unit 70 may be illuminated with light of various colors.

The light emission wavelength of the second organic light emitting layer 30A may be the same as the light emission wavelength of the first organic light emitting layer. A bright illumination light is obtained by the organic light emitting layer having two or more layers.

Figure 7:
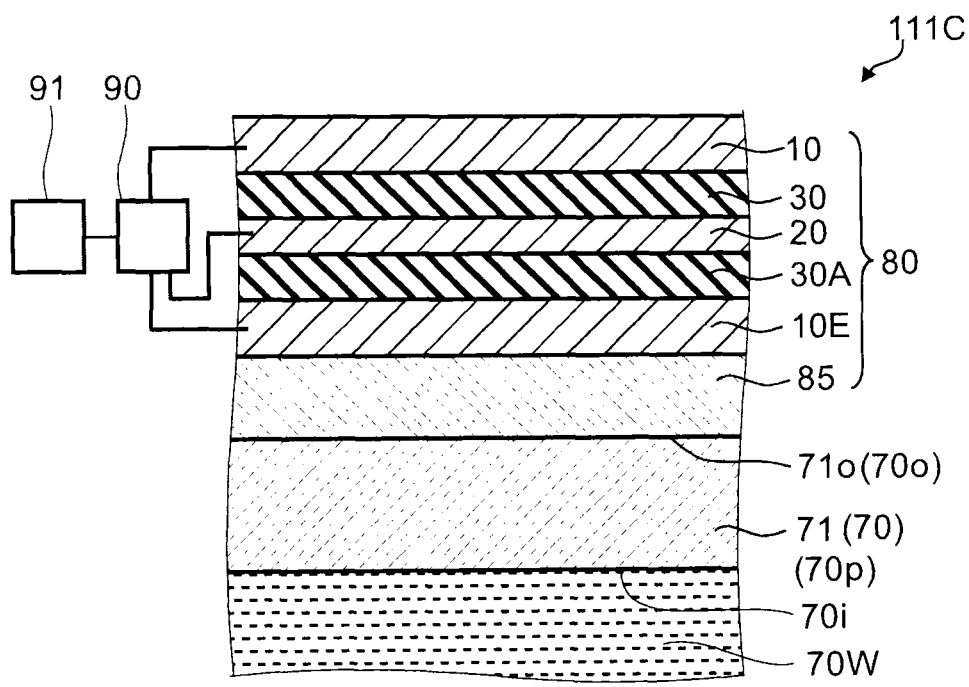
FIG. 7 is a schematic cross-sectional view showing another liquid container according to the first embodiment.

FIG. 7 is a schematic cross-sectional view showing another liquid container according to the first embodiment.

FIG. 7 is a cross-sectional view corresponding to the cross section along line A1-A2 of FIG. 1A.

In the liquid container 111C according to the embodiment as shown in FIG. 7, the light emitting unit 80 further includes a third electrode 10E and the second organic light emitting layer 30A. In such a case, the organic light emitting layer 30 is used as the first organic light emitting layer 30.

The third electrode 10E is provided between the second electrode 20 and the transmissive portion 70p of the tank unit 70. The second organic light emitting layer 30A is provided between the third electrode 10E and the second electrode 20.

For example, the configuration and materials described in regard to the first electrode 10 are applicable to the third electrode 10E. For example, the configuration and materials described in regard to the second electrode 20 are applicable to the third electrode 10E. For example, the first electrode 10 and the third electrode 10E are cathodes; and the second electrode 20 is an anode. For example, the first electrode 10 and the third electrode 10E may be the anodes; and the second electrode 20 may be the cathode.

The configuration and materials described in regard to the first organic light emitting layer (the organic light emitting layer 30) are applicable to the second organic light emitting layer 30A. The light emission wavelength (e.g., the peak wavelength) of the second organic light emitting layer 30A may be different from the light emission wavelength (e.g., the peak wavelength) of the first organic light emitting layer (the organic light emitting layer 30).

In the case where the drive unit 90 is provided, the drive unit 90 is further connected to the third electrode 10E. The drive unit 90 supplies the current to the light emitting unit 80 to flow between the third electrode 10E and the second electrode 20.

The liquid container 111C may further include the control unit 91. The control unit 91 also controls the current flowing between the third electrode 10E and the second electrode 20. The intensity of the light emitted from the first organic light emitting layer (the organic light emitting layer 30) and the intensity of the light emitted from the second organic light emitting layer 30A may be controlled by the control unit 91. The liquid 70W contained in the tank unit 70 may be illuminated with light of various colors.

The light emission wavelength of the second organic light emitting layer 30A may be the same as the light emission wavelength of the first organic light emitting layer. A bright illumination light is obtained by the organic light emitting layer having two or more layers.

Figure 8:
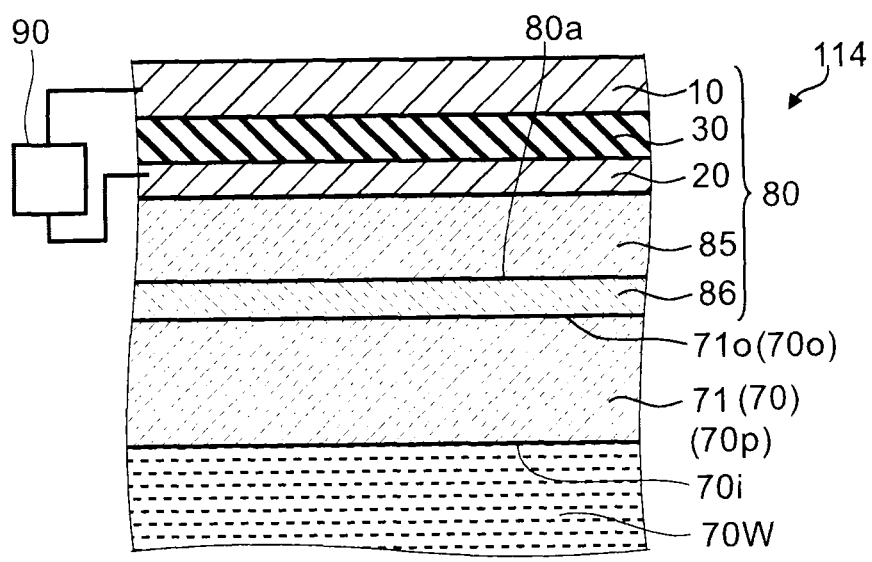
FIG. 8 is a schematic cross-sectional view showing another liquid container according to the first embodiment.

FIG. 8 is a schematic cross-sectional view showing another liquid container according to the first embodiment.

FIG. 8 is a cross-sectional view corresponding to the cross section along line A1-A2 of FIG. 1A.

In the liquid container 114 according to the embodiment as shown in FIG. 8, the light emitting unit 80 further includes an optical layer 86. Otherwise, the configuration is similar to, for example, that of the liquid container 111, and a description is therefore omitted.

The optical layer 86 is provided between the second electrode 20 and the light-transmissive portion of the tank unit 70 (the portion 70p of the tank unit 70 recited above). The optical layer 86 contacts the portion 70p of the tank unit 70 recited above. In this example, the substrate 85 is provided; and the optical layer 86 is disposed between the substrate 85 and the portion 70p of the tank unit 70 recited above. The optical layer 86 is provided on the tank unit 70 side of the light emitting unit 80.

The optical layer 86 is light-transmissive.

The refractive index of the optical layer 86 is lower than the refractive index of the second electrode 20. The refractive index of the optical layer 86 is, for example, not less than 1.3 and not more than 1.55. The absolute value of the difference between the refractive index of the optical layer 86 and the refractive index of the second electrode 20 is, for example, not less than 0.2.

The refractive index of the optical layer 86 is near the refractive index of the portion 70p of the tank unit 70 recited above. The absolute value of the difference between the refractive index of the optical layer 86 and the refractive index of the portion 70p of the tank unit 70 recited above is, for example, not more than 0.5. It is favorable for the absolute value of the difference to be less than 0.2. It is more favorable for the absolute value of the difference to be not more than 0.1.

For example, the optical layer 86 functions as a refractive index adjusting layer between the second electrode 20 and the portion 70p of the tank unit 70 recited above. By providing the optical layer 86, the efficiency of the light 45 entering the liquid 70W can be increased.

The optical layer 86 may include, for example, various resins such as a silicone resin, an acrylic resin, etc.

The light emitting unit 80 can be adhered to the tank unit 70 by the optical layer 86. The optical layer 86 adheres the light emitting surface 80a of the light emitting unit 80 to the tank unit 70. The optical layer 86 functions as, for example, an adhesion layer.

The optical layer 86 may be adhesive. The optical layer 86 may be adherent. For example, the tank unit 70 and the substrate 85 of the light emitting unit 80 are bonded to each other by the optical layer 86.

The optical layer 86 may be provided in the liquid containers 110, 111A to 111C, 112, and 113 as well.

Figure 9:
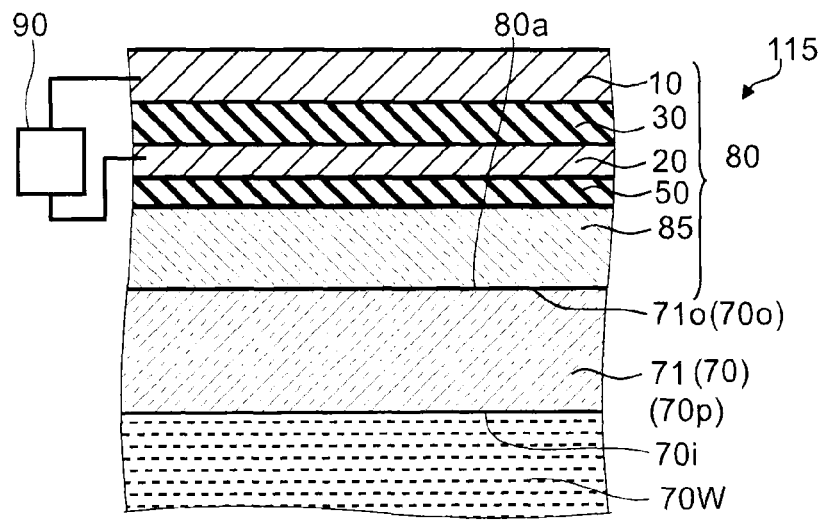
FIG. 9 is a schematic cross-sectional view showing another liquid container according to the first embodiment.

FIG. 9 is a schematic cross-sectional view showing another liquid container according to the first embodiment.

FIG. 9 is a cross-sectional view corresponding to the cross section along line A1-A2 of FIG. 1A.

In the liquid container 115 according to the embodiment as shown in FIG. 9, the light emitting unit 80 further includes an optical path control layer 50. Otherwise, the configuration is similar to, for example, that of the liquid container 111, and a description is therefore omitted.

The optical path control layer 50 is provided between the second electrode 20 and the light-transmissive portion of the tank unit 70 (the portion 70p of the tank unit 70 recited above).

In the example, the substrate 85 is provided in the light emitting unit 80. The substrate 85 is provided between the second electrode 20 and the at least one portion 70p recited above. In such a case, the optical path control layer 50 is provided between the second electrode 20 and the substrate 85. The optical path control layer 50 contacts, for example, the second electrode 20 and the substrate 85.

The optical path control layer 50 changes the travel direction of the light 45 emitted from the organic light emitting layer 30. The optical path control layer 50 may include, for example, a light-scattering layer, etc. By providing the optical path control layer 50, the light 45 can efficiently travel toward the tank unit 70 from the second electrode 20.

The optical path control layer 50 may be provided in the liquid containers 110, 111A to 111C, and 114 as well.

FIG. 10A to FIG. 10D are schematic cross-sectional views showing portions of liquid containers according to the first embodiment.

These drawings show configurations of the optical path control layer 50.

Figure 10A:
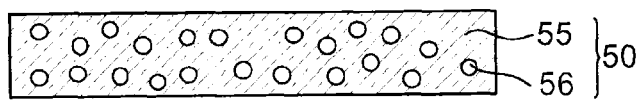
FIG. 10A to FIG. 10D are schematic cross-sectional views showing portions of liquid containers according to the first embodiment.

As shown in FIG. 10A, the optical path control layer 50 includes, for example, a resin layer 55 and multiple particles 56 dispersed in the resin layer 55. The resin layer 55 may include, for example, a polysiloxane polymer, etc. However, the material of the resin layer 55 is arbitrary. The particle 56 may include, for example, at least one selected from a silica particle and a polystyrene granule. However, the material of the particle 56 is arbitrary. The diameter of the particle 56 is, for example, not less than 0.2 μm and not more than 100 μm. The thickness of the resin layer 55 is, for example, not less than 0.2 μm and not more than 100 μm.

The absolute value of the difference between the refractive index of the resin layer 55 and the refractive index of the particle 56 is, for example, not less than 0.1, and more favorably not less than 0.2. In the case where the absolute value of the difference between the refractive index of the resin layer 55 and the refractive index of the particle 56 is small, the scattering characteristics decrease. By the absolute value of the difference of the refractive index being set to be not less than 0.1, sufficient scattering properties are obtained. The configuration of the particle 56 is arbitrary and may be a sphere (including a flattened sphere), a polyhedral solid, a needle, etc.

For example, the refractive index of the resin layer 55 is equivalent to the refractive index of the second electrode 20. The absolute value of the difference between the refractive index of the resin layer 55 and the refractive index of the second electrode 20 is less than 0.2. The resin layer 55 is transparent.

Figure 10B:
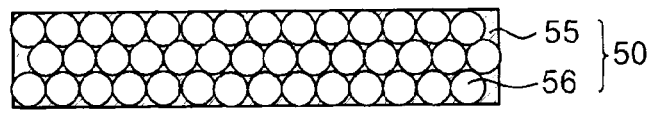

As shown in FIG. 10B, the multiple particles 56 of the optical path control layer 50 may be disposed to contact each other.

Figure 10C:
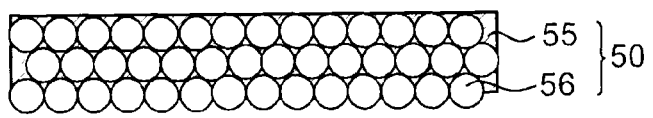

As shown in FIG. 10C, portions of the surfaces of the particles 56 of the optical path control layer 50 may be exposed. Portions of the particles 56 are embedded in the substrate 85.

Figure 10D:
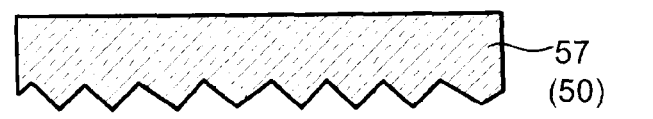

As shown in FIG. 10D, a transparent layer 57 in which an unevenness is formed in the surface of the transparent layer 57 may be used as the optical path control layer 50. The unevenness of the transparent layer 57 conforms to, for example, an unevenness provided in the surface of the substrate 85. For example, a substrate in which any unevenness such as a microlens layer, a layer with trenches, a layer with pyramids, etc., is provided is used as the substrate 85. The transparent layer 57 may be formed by forming a transparent film on such a substrate 85. The refractive index of the transparent layer 57 is different from the refractive index of the substrate 85. A polysiloxane polymer, etc., may be used as the transparent layer 57. The transparent layer 57 may include a component other than the resin such as a filler, etc.

Figure 11:
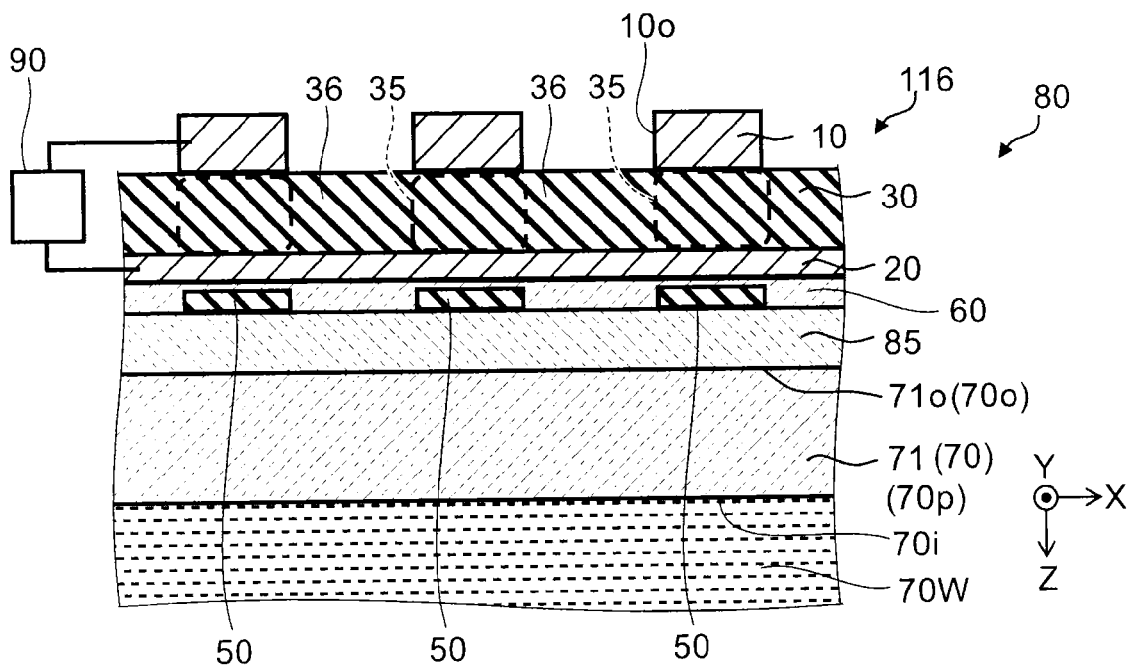
FIG. 11 is a schematic cross-sectional view showing another liquid container according to the first embodiment.

FIG. 11 is a schematic cross-sectional view showing another liquid container according to the first embodiment.

FIG. 11 is a cross-sectional view corresponding to the cross section along line A1-A2 of FIG. 1A.

In the liquid container 116 according to the embodiment as shown in FIG. 11, the light emitting unit 80 further includes the optical path control layer 50. Otherwise, the configuration is similar to, for example, that of the liquid container 112, and a description is therefore omitted. In other words, the optical path control layer 50 is provided in the liquid container 112 in which the opening 10o is provided in the first electrode 10.

In the example, the substrate 85 is provided in the light emitting unit 80. The optical path control layer 50 is provided between the second electrode 20 and the substrate 85.

The optical path control layer 50 overlaps the first electrode 10 when projected onto the X-Y plane. The optical path control layer 50 overlaps the superimposed portion 35 of the organic light emitting layer 30 when projected onto the X-Y plane. For example, the optical path control layer 50 does not overlap the opening 10o. For example, the optical path control layer 50 does not overlap the non-superimposed portion 36.

By providing the optical path control layer 50 to overlap the superimposed portion 35 that emits light, the light 45 can be extracted efficiently toward the tank unit 70 from the second electrode 20. By the optical path control layer 50 not overlapping the non-superimposed portion 36, the user can view the interior of the liquid 70W via the opening 10o.

In the example, the optical path control layer 50 is provided on the substrate 85. A light-transmitting layer 60 is provided to embed the optical path control layer 50. For example, the refractive index of the light-transmitting layer 60 is equivalent to the refractive index of the second electrode 20. The absolute value of the difference between the refractive index of the light-transmitting layer 60 and the refractive index of the second electrode 20 is less than 0.2. By providing the light-transmitting layer 60, the flatness improves. Thereby, for example, the second electrode 20, the organic light emitting layer 30, etc., can be formed uniformly. The optical path control layer 50 may be provided to contact the second electrode 20.

Figure 12:
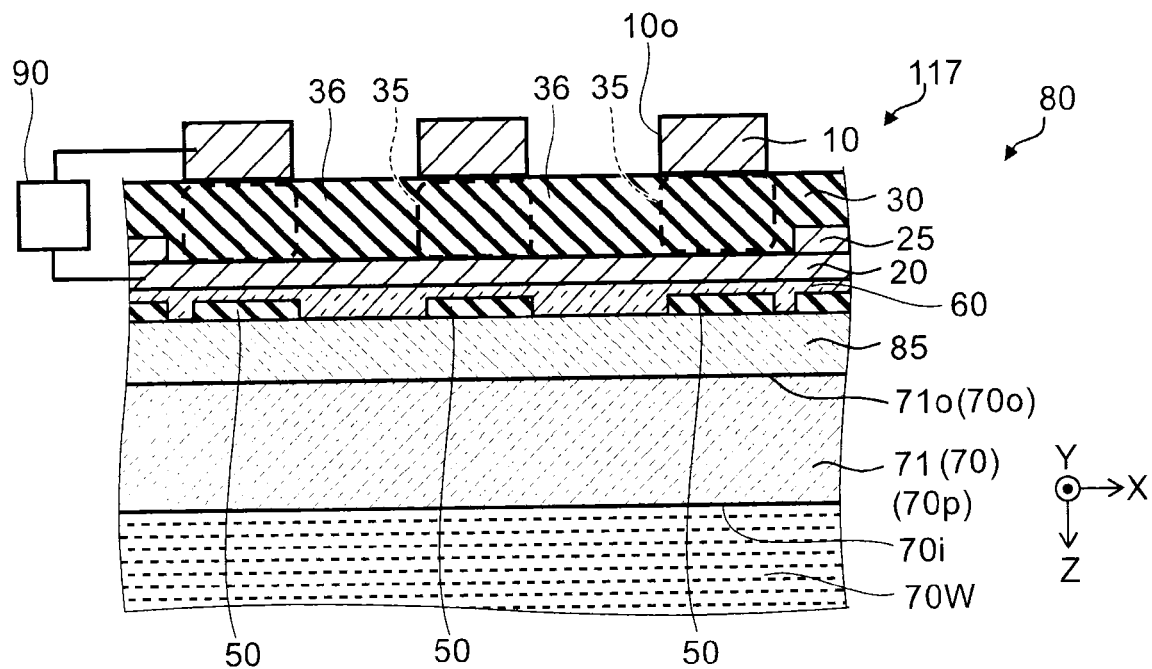
FIG. 12 is a schematic cross-sectional view showing another liquid container according to the first embodiment.

FIG. 12 is a schematic cross-sectional view showing another liquid container according to the first embodiment.

FIG. 12 is a cross-sectional view corresponding to the cross section along line A1-A2 of FIG. 1A.

In the liquid container 117 according to the embodiment as shown in FIG. 12, the light emitting unit 80 further includes the optical path control layer 50. Otherwise, the configuration is similar to, for example, that of the liquid container 113, and a description is therefore omitted. In other words, the optical path control layer 50 is provided in the liquid container 113 in which the opening 10o is provided in the first electrode 10 and the interconnection 25 is provided.

In the example, the optical path control layer 50 is provided to further overlap the interconnection 25 when projected onto the X-Y plane. Thereby, the travel direction of the light blocked by the interconnection 25 is changed. Thereby, the light extraction efficiency can be increased even in the case where the interconnection 25 is provided.

Second Embodiment

The embodiment relates to a container illumination device that illuminates a liquid container.

Figure 13:
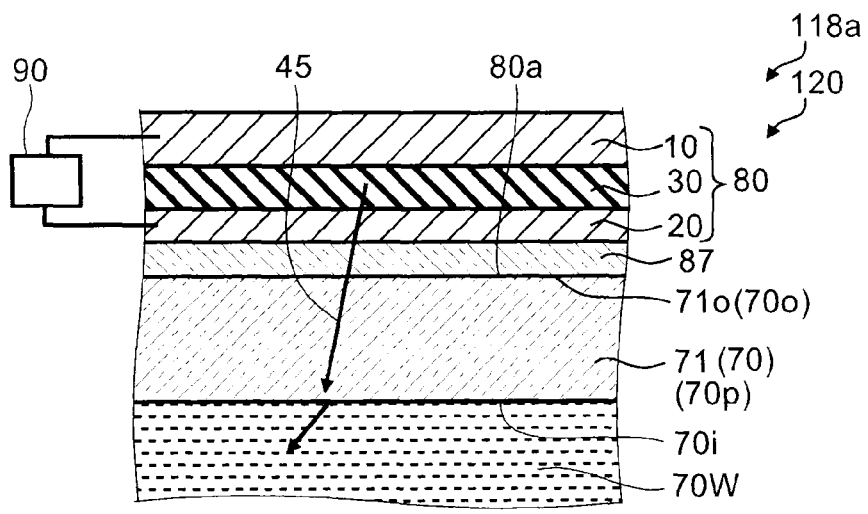
FIG. 13 is a schematic cross-sectional view showing a container illumination device according to a second embodiment.

FIG. 13 is a schematic cross-sectional view showing the container illumination device according to the second embodiment.

As shown in FIG. 13, the container illumination device 120 and the liquid container 118a according to the embodiment includes the light emitting unit 80 and an adhesion layer 87.

The container illumination device 120 is provided to oppose the outer surface 70o of the tank unit 70 (the container). The container illumination device 120 illuminates the liquid 70W contained in the tank unit 70 (the container).

The light emitting unit 80 includes the first electrode 10, the second electrode 20, and the organic light emitting layer 30. The organic light emitting layer 30 is provided between the first electrode 10 and the second electrode 20. The light emitting unit 80 has the light emitting surface 80a on the second electrode 20 side.

The adhesion layer 87 is provided on the light emitting surface 80a. The adhesion layer 87 is capable of adhering the light emitting surface 80a to the tank unit 70 (the at least one portion 70p of the tank unit 70). As described in regard to FIG. 1A, the tank unit 70 is capable of storing the liquid 70W in the interior of the tank unit 70. The portion 70p of the tank unit 70 is light-transmissive. The adhesion layer 87 is light-transmissive.

The adhesion layer 87 may include, for example, various resins such as a silicone resin, an acrylic resin, etc. The light emitting unit 80 can be adhered to the tank unit 70 by the adhesion layer 87.

According to the container illumination device 120 according to the embodiment, a container illumination device that can efficiently illuminate the liquid can be provided.

Figure 14:
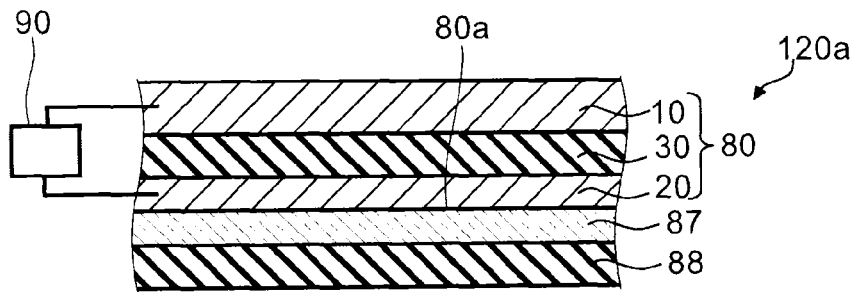
FIG. 14 is a schematic cross-sectional view showing another container illumination device according to the second embodiment.

FIG. 14 is a schematic cross-sectional view showing another container illumination device according to the second embodiment. As shown in FIG. 14, the container illumination device 120a according to the embodiment further includes a protective layer 88. The protective layer 88 contacts the adhesion layer 87. The protective layer 88 is separated from the adhesion layer 87 when using the container illumination device 120a. The adhesion layer 87 that is exposed is adhered to the tank unit 70. By providing the protective layer 88, the adhesion layer 87 can be protected.

Figure 15:
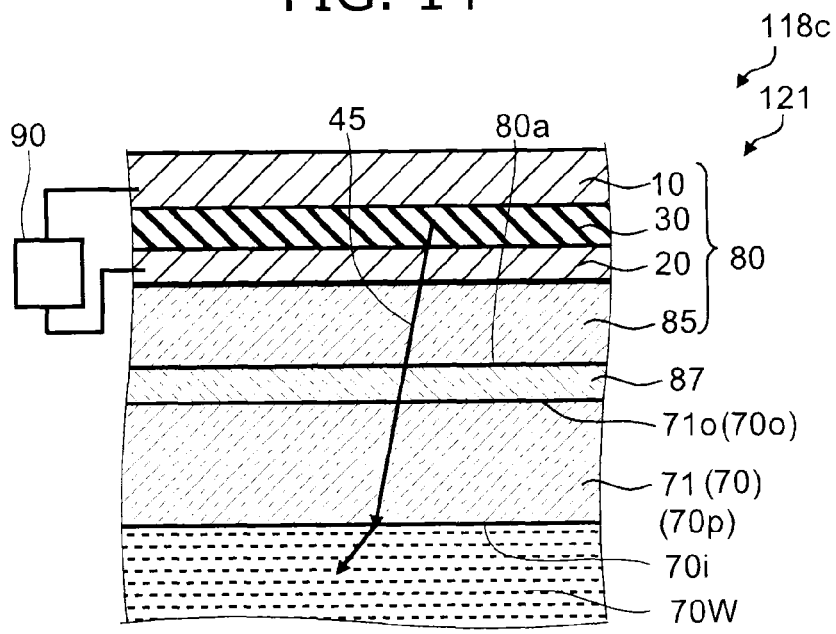
FIG. 15 is a schematic cross-sectional view showing another container illumination device according to the second embodiment.

FIG. 15 is a schematic cross-sectional view showing another container illumination device according to the second embodiment. In the container illumination device 121 and the liquid container 118c according to the embodiment as shown in FIG. 15, the light emitting unit 80 further includes the substrate 85. The substrate 85 is disposed between the second electrode 20 and the adhesion layer 87. In the container illumination device 121 as well, a container illumination device that can efficiently illuminate the liquid can be provided.

In the container illumination devices 120 and 120a, the configuration of the light emitting unit 80 described in regard to the liquid containers 110, 111A to 111C, and 112 to 117 of the first embodiment are applicable to the light emitting unit 80. At least one selected from the opening 10o of the first electrode 10, the interconnection 25, the optical layer 86, the optical path control layer 50, the light-transmitting layer 60, the drive unit 90, and the control unit 91 described in regard to the first embodiment may be further provided in the container illumination device according to the embodiment.

Third Embodiment

The embodiment relates to a container member used in a liquid container.

Figure 16A:
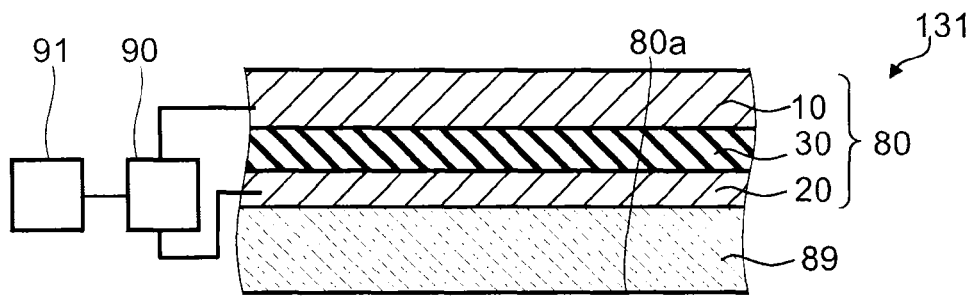
FIG. 16A and FIG. 16B are schematic views showing a container member according to a third embodiment.
Figure 16B:
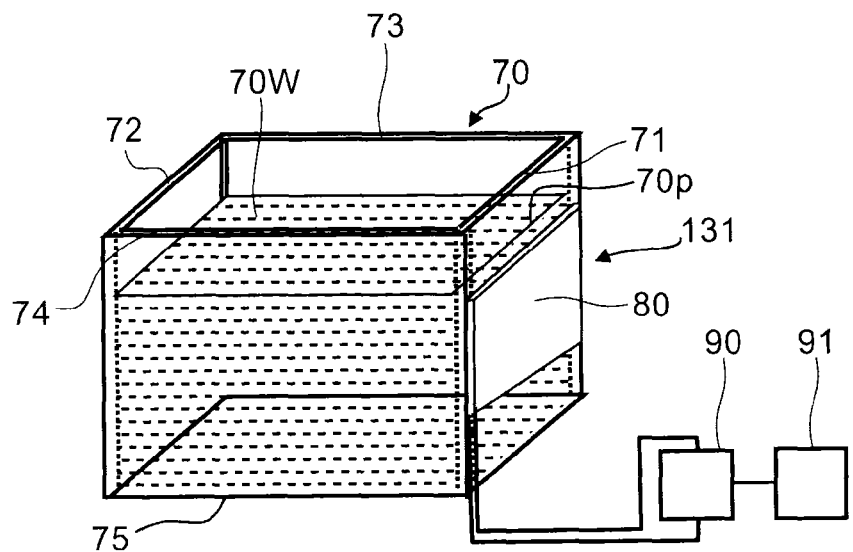

FIG. 16A and FIG. 16B are schematic views showing the container member according to the third embodiment.

FIG. 16A is a schematic cross-sectional view. FIG. 16B is a schematic perspective view showing the state of use of the container member.

As shown in FIG. 16A and FIG. 16B, the container member 131 according to the embodiment includes a substrate unit 89 and the light emitting unit 80.

The substrate unit 89 is provided at a portion of the tank unit 70. A liquid can be contained in the interior of the tank unit 70. The at least one portion 70p of the tank unit 70 is light-transmissive. The substrate unit 89 is used as a portion of the portion 70p that is light-transmissive.

For example, the substrate unit 89 is used as at least one portion of the first side portion 71 of the tank unit 70. The substrate unit 89 may be used as at least one portion of the bottom portion 75 of the tank unit 70.

The substrate unit 89 is light-transmissive. The substrate unit 89 may include, for example, glass, a resin, etc.

The light emitting unit 80 includes the first electrode 10, the second electrode 20, and the organic light emitting layer 30. The first electrode 10 opposes the substrate unit 89. The second electrode 20 is provided between the first electrode 10 and the substrate unit 89. The second electrode 20 is light-transmissive. The organic light emitting layer 30 is provided between the first electrode 10 and the second electrode 20.

According to the embodiment, a container member that can efficiently illuminate a liquid can be provided.

At least one selected from the opening 10o of the first electrode 10, the interconnection 25, the optical layer 86, the optical path control layer 50, the light-transmitting layer 60, the drive unit 90, and the control unit 91 described in regard to the first embodiment may be further provided in the container member according to the embodiment.

Fourth Embodiment

The embodiment relates to an illumination system including a liquid container.

Figure 17:
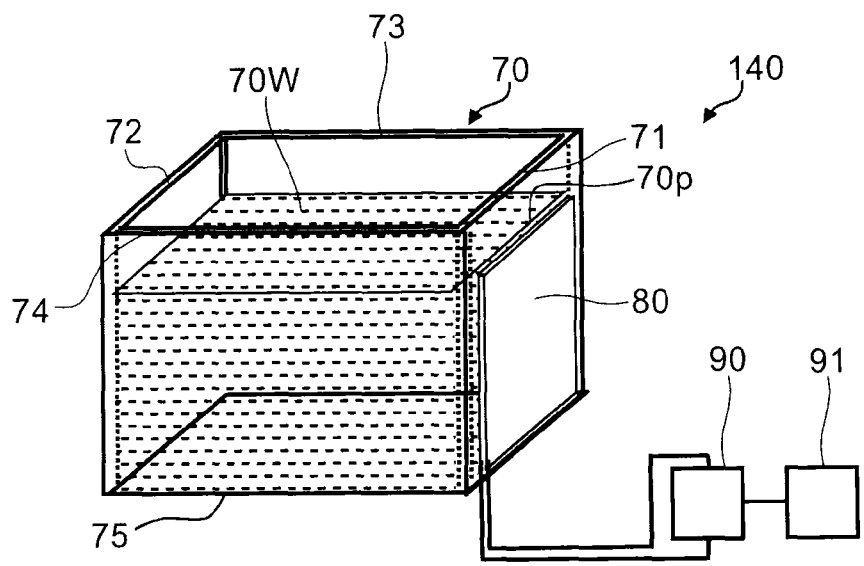
FIG. 17 is a schematic perspective view showing a container illumination system according to a fourth embodiment.

FIG. 17 is a schematic perspective view showing the container illumination system according to the fourth embodiment.

As shown in FIG. 17, the container illumination system 140 according to the embodiment includes the tank unit 70, the light emitting unit 80, and the control unit 91.

The tank unit 70 is capable of storing the liquid 70W in the interior of the tank unit 70. The at least one portion 70p of the tank unit 70 is light-transmissive. The portion 70p of the tank unit 70 recited above includes the outer surface 70o.

The light emitting unit 80 includes the first electrode 10, the second electrode 20, and the organic light emitting layer 30. The first electrode 10 opposes the outer surface 70o of the at least one portion 70p recited above. The second electrode 20 is provided between the first electrode 10 and the at least one portion 70p recited above. The second electrode 20 is light-transmissive. The organic light emitting layer 30 is provided between the first electrode 10 and the second electrode 20.

The control unit 91 controls the current flowing between the first electrode 10 and the second electrode 20. In the example, the drive unit 90 is provided. The drive unit 90 is electrically connected to the first electrode 10 and the second electrode 20 and supplies the current to the light emitting unit 80 to flow between the first electrode 10 and the second electrode 20. The control unit 91 is connected to the drive unit 90. The control unit 91 controls the current flowing between the first electrode 10 and the second electrode 20 by controlling the drive unit 90. The drive unit 90 may be included in the control unit 91.

For example, multiple light emitting units 80 may be provided in the embodiment. The wavelengths (e.g., the peak wavelengths) of the light emitted from the multiple light emitting units 80 may be different from each other. In the embodiment, the multiple first electrodes may be provided; and multiple portions (e.g., the first to third portions 30a to 30c, etc.) of the organic light emitting layer 30 may be provided. In the embodiment, multiple organic light emitting layers (the organic light emitting layer 30, the second organic light emitting layer 30A, etc.) may be provided. The control unit 91 may control the brightness of multiple light of different wavelengths.

In the embodiment, the light emitting unit 80 emits, for example, light of various colors such as white, red, orange, yellow, green, blue, indigo, violet, etc. The container illumination system according to the embodiment may be used as, for example, the decorative illumination of a fountain, pool, etc. According to the embodiment, the ambiance inside the liquid may be controlled.

For example, driving with a direct current, driving with pulse width modulation (PWM), etc., are applicable to drive the organic light emitting layer 30 (and the second organic light emitting layer 30A, etc.) of the light emitting unit 80. The control unit 91 and the drive unit 90 are provided separately from the liquid 70W.

According to the embodiment, a container illumination system that can efficiently illuminate a liquid can be provided.

At least one selected from the opening 10o of the first electrode 10, the interconnection 25, the optical layer 86, the optical path control layer 50, the light-transmitting layer 60, the drive unit 90, and the control unit 91 described in regard to the first embodiment may be further provided in the container illumination system according to the embodiment.

The configurations described in regard to the first embodiment are applicable to the first electrode 10, the second electrode 20, the organic light emitting layer 30, the substrate 85, the interconnection 25, the optical layer 86, the optical path control layer 50, and the light-transmitting layer 60 of the second to fourth embodiments.

According to the embodiments, a liquid container, a container illumination device, a container member, and a container illumination system that can efficiently illuminate a liquid are provided.

Hereinabove, embodiments of the invention are described with reference to specific examples. However, the embodiments of the invention are not limited to these specific examples. For example, one skilled in the art may similarly practice the invention by appropriately selecting specific configurations of components included in the liquid container, the container illumination device, the container member, and the container illumination system such as the first electrode, the second electrode, the organic light emitting layer, the substrate, the interconnect, the optical layer, the optical path control layer, the light-transmitting layer, etc., from known art; and such practice is included in the scope of the invention to the extent that similar effects are obtained.

Further, any two or more components of the specific examples may be combined within the extent of technical feasibility and are included in the scope of the invention to the extent that the purport of the invention is included.

Moreover, all liquid containers, container illumination devices, container members, and container illumination systems practicable by an appropriate design modification by one skilled in the art based on the liquid containers, the container illumination devices, the container members, and the container illumination systems described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A liquid container, comprising:
a tank unit capable of storing a liquid in an interior of the tank unit, at least one portion of the tank unit being light-transmissive;
a light emitting unit contacting the at least one portion, the light emitting unit including:
a first electrode opposing an outer surface of the at least one portion;
a second electrode provided between the first electrode and the at least one portion, the second electrode being light-transmissive; and
an organic light emitting layer provided between the first electrode and the second electrode; and
an adhesion layer provided between the at least one portion and the light emitting unit to adhere the at least one portion to the light emitting unit, the adhesion layer being light-transmissive.

2. The container according to claim 1, wherein
the first electrode is light-reflective, and
the organic light emitting layer has a superimposed portion overlapping the first electrode and a non-superimposed portion not overlapping the first electrode when projected onto a plane perpendicular to a stacking direction from the first electrode toward the second electrode.

3. The container according to claim 1, wherein the light emitting unit further includes an optical layer provided between the at least one portion and the second electrode, the optical layer having a refractive index lower than a refractive index of the second electrode.

4. The container according to claim 3, wherein an absolute value of a difference between the refractive index of the optical layer and the refractive index of the second electrode is not less than 0.2.

5. The container according to claim 3, wherein an absolute value of a difference between the refractive index of the optical layer and a refractive index of the at least one portion of the tank unit is not more than 0.5.

6. The container according to claim 3, wherein an absolute value of a difference between the refractive index of the optical layer and a refractive index of the at least one portion of the tank unit is less than 0.2.

7. The container according to claim 3, further comprising a substrate provided between the optical layer and the second electrode, the substrate being light-transmissive.

8. The container according to claim 1, wherein the light emitting unit further includes:
a substrate provided between the at least one portion and the second electrode, the substrate being light-transmissive; and
an optical path control layer provided between the second electrode and the substrate, the optical path control layer being configured to change a travel direction of light emitted from the organic light emitting layer.

9. The container according to claim 8, wherein the optical path control layer contacts the at least one portion of the tank.

10. The container according to claim 8, wherein
the first electrode is light-reflective,
the organic light emitting layer has a superimposed portion overlapping the first electrode and a non-superimposed portion not overlapping the first electrode when projected onto a plane perpendicular to a stacking direction from the first electrode toward the second electrode, and
at least one portion of the optical path control layer overlaps the superimposed portion when projected onto the plane.

11. The container according to claim 10, wherein the optical path control layer does not overlap the non-superimposed portion when projected onto the plane.

12. The container according to claim 8, wherein the optical path control layer is configured to scatter the light emitted from the organic light emitting layer.

13. The container according to claim 8, wherein the optical path control layer includes a resin layer and a plurality of particles dispersed in the resin layer.

14. The container according to claim 1, wherein the adhesion layer includes at least one selected from a silicone resin and an acrylic resin.

15. The liquid container according to claim 1, wherein the first electrode is light-reflective.

16. The container according to claim 1, wherein
the first electrode is a cathode, and
the second electrode is an anode.

17. A container illumination device, comprising:
a light emitting unit including
a first electrode,
a second electrode, and
an organic light emitting layer provided between the first electrode and the second electrode,
the light emitting unit having a light emitting surface provided on a side of the second electrode; and
an adhesion layer provided on the light emitting surface, the adhesion layer being light-transmissive and configured to adhere the light emitting surface to at least one portion of a tank unit capable of storing a liquid in an interior of the tank unit, the at least one portion being light-transmissive.

18. A container member, comprising:
a substrate unit configured to be used as a portion of a tank unit capable of storing a liquid in an interior of the tank unit, at least one portion of the tank unit being light-transmissive;
a light emitting unit including:
a first electrode opposing the substrate unit;
a second electrode provided between the first electrode and the substrate unit, the second electrode being light-transmissive; and
an organic light emitting layer provided between the first electrode and the second electrode; and
an adhesion layer provided between the at least one portion and the light emitting unit to adhere the at least one portion to the light emitting unit, the adhesion layer being light-transmissive.

19. A container illumination system, comprising:
a tank unit capable of storing a liquid in an interior of the tank unit, at least one portion of the tank unit being light-transmissive;
a light emitting unit including
a first electrode opposing an outer surface of the at least one portion,
a second electrode provided between the first electrode and the at least one portion, the second electrode being light-transmissive, and
an organic light emitting layer provided between the first electrode and the second electrode;
an adhesion layer provided between the at least one portion and the light emitting unit to adhere the at least one portion to the light emitting unit, the adhesion layer being light-transmissive; and
a control unit configured to control a current flowing between the first electrode and the second electrode.

* * * * *